(12) United States Patent
Lee

(10) Patent No.: US 7,285,904 B2
(45) Date of Patent: Oct. 23, 2007

(54) ORGANIC EL DISPLAY WITH AN ORGANIC COMPOUND DERIVATIVE LAYER

(75) Inventor: Jun-Yeob Lee, Gyeonggi-do (KR)

(73) Assignee: Samsung SDI Co., Ltd., Suwon (KR)

( * ) Notice: Subject to any disclaimer, the term of this patent is extended or adjusted under 35 U.S.C. 154(b) by 78 days.

(21) Appl. No.: 10/173,680

(22) Filed: Jun. 18, 2002

(65) Prior Publication Data

US 2003/0025445 A1 Feb. 6, 2003

(30) Foreign Application Priority Data

Aug. 1, 2001 (KR) ................................ 2001-46633

(51) Int. Cl.
*H01J 1/62* (2006.01)
*H01J 63/04* (2006.01)
*H01L 29/80* (2006.01)
*B32B 9/00* (2006.01)

(52) U.S. Cl. .................... 313/503; 313/504; 257/40; 428/690

(58) Field of Classification Search ........ 313/503–504, 313/506; 428/690, 917; 257/40
See application file for complete search history.

(56) References Cited

U.S. PATENT DOCUMENTS

| | | | | |
|---|---|---|---|---|
| 4,680,103 A | * | 7/1987 | Beilin et al. ................. | 428/403 |
| 4,902,929 A | * | 2/1990 | Toyoda et al. ............... | 313/503 |
| 5,104,749 A | * | 4/1992 | Sato et al. ................... | 428/690 |
| 5,294,870 A | * | 3/1994 | Tang et al. .................. | 313/504 |
| 5,306,572 A | * | 4/1994 | Ohashi et al. ............... | 428/690 |
| 5,965,063 A | * | 10/1999 | Agata et al. ................. | 428/407 |
| 6,165,383 A | * | 12/2000 | Chou .......................... | 428/447 |
| 6,586,763 B2 | * | 7/2003 | Marks et al. ................. | 438/22 |
| 6,861,091 B2 | * | 3/2005 | Sellinger ..................... | 428/690 |
| 6,908,696 B2 | * | 6/2005 | Imamura et al. ............ | 313/506 |
| 2005/0196710 A1 | * | 9/2005 | Shiroguchi .................. | 430/322 |
| 2006/0166411 A1 | * | 7/2006 | Morisue et al. ............. | 438/149 |

FOREIGN PATENT DOCUMENTS

| | | |
|---|---|---|
| JP | 03-084892 | 4/1991 |
| JP | 08-302339 | * 11/1996 |
| JP | 09-279135 | 10/1997 |
| JP | 10-95971 | 4/1998 |
| JP | 10-095971 A1 | 4/1998 |
| JP | 2000-323276 | 11/2000 |
| JP | 2001-113623 | 4/2001 |
| WO | 0103923 | 1/2001 |

* cited by examiner

*Primary Examiner*—Nimeshkumar D. Patel
*Assistant Examiner*—Peter Macchiarolo
(74) *Attorney, Agent, or Firm*—H.C. Park & Associates, PLC

(57) ABSTRACT

An organic EL display includes an anode electrode; a cathode electrode; at least one organic layer selected from a hole transport layer, a hole injection layer, a light-emitting layer, an electron transporting layer, and an electron injection layer between the anode electrode and the cathode electrode; and at least one organic compound derivative layer arranged between the anode electrode and the cathode electrode, the organic compound derivative layer having a structure of formula:

$R_1R_2MR_3R_4$, where "M" is one metal selected from a group consisting of Ti, Pt and one metal belonging to groups 13 and 14 of periods 3 to 5.

11 Claims, 3 Drawing Sheets

ORGANIC EL DISPLAY WITH AN ORGANIC COMPOUND DERIVATIVE LAYER

BACKGROUND OF THE INVENTION

1. Field of the Invention

The present invention relates to an organic EL display and a method of manufacturing the same.

2. Description of Related Art

FIG. 1 is a cross-sectional view illustrating a conventional organic EL display, and particularly shows a low molecular organic EL display.

The organic EL display of FIG. 1 includes an anode electrode 12, a hole injection layer 13, a hole transport layer 14, an organic light-emitting layer 15, an electron transport layer 16, an electron injection layer 17, and a cathode electrode 18, which are stacked on a substrate 11 in described order. Of the layers, the electron transport layer 16 can be removed.

Eventhough not shown, a high molecular organic EL display generally includes an anode electrode, a hole transport layer, an organic light-emitting layer, and a cathode electrode, which are sequentially stacked.

Holes move from the anode electrode 12 to the organic light-emitting layer 15, and electrons move from the cathode electrode 18 to the organic light-emitting layer 15. The organic light-emitting layer 15 emits light by excitation and recombination of electrons and holes injected from a cathode and an anode. Therefore, if the hole injection efficiency and the electron injection efficiency are improved, the device characteristics of the organic EL display are also improved.

In the case of a low molecular organic EL display, the layers are formed using a vacuum deposition technique. However, in case of a high molecular organic EL display, the layers are formed using a solution processing technique, which result in certain limitations to forming the organic light-emitting layer made of an organic material.

In particular, the hole transport layer must be stable to a wet coating process to form the organic light-emitting layer using an organic solvent. The hole transport layer is generally made of a water-soluble high molecular material such as a PEDOT (a mixture of a poly(3,4)-ethylenedioxythiophene and a polystyrenesulfonate) or a PANI (a mixture of a polyaniline and a polystyrenesulfonate). However, such a hole transport layer has a problem in that an interface characteristic between the hole transport layer and the hydrophobic organic light-emitting layer is lowered.

For example, since a bonding power between the hole transport layer and the organic light-emitting layer is low, a life span of the organic EL display is shortened. Also, uniform organic light-emitting layer cannot be formed on the hydrophilic hole transport layer using an ink-jet printing technique or a laser induced thermal imaging (LITI) technique, even though the ink-jet printing technique and the LITI technique have an advantage in that it is easy to define pixels and achieve a full color light emission.

Another problem for the organic EL display is there is a poor interface characteristic between an anode electrode and a hole transport layer. Migration of oxygen from the anode electrode to a hole transport layer or a light-emitting layer and permeation of moisture through the anode/hole transport layer or the hole transport layer/light-emitting layer interface can damage the device characteristic of the organic EL display.

In efforts to overcome the problems described above, a silicon oxide layer or a silicon nitride layer is arranged between the anode electrode and the hole transport layer so as to improve a device characteristic of the organic EL display.

U.S. Pat. No. 4,954,528 discloses a silicon carbide (SiC) layer arranged between the anode electrode and the hole transport layer. U.S. Pat. No. 4,188,565 discloses a silicon oxynitride layer arranged between the anode electrode and the hole transport layer. U.S. Pat. No. 5,643,685 discloses a silicon oxide layer arranged between the anode electrode and the hole transport layer. U.S. Pat. No. 5,476,725 discloses a tantalum oxide layer arranged between the anode electrode and the hole transport layer. However, the U.S. patents stated above require a high vacuum process and have a complicated manufacturing process.

SUMMARY OF THE INVENTION

To overcome the problems described above, preferred embodiments of the present invention provide an organic EL display with a hole transport layer having a high brightness.

It is another object of the present invention to provide and organic EL display having a high efficiency.

It is another object of the present invention to provide an organic EL display having a lengthy life span.

It is another object of the present invention to provide an organic EL display having a simple manufacturing process.

In order to achieve the above object, the preferred embodiments of the present invention provide an organic EL display, comprising: an anode electrode; a cathode electrode; at least one organic layer selected from a hole injection layer, a hole transport layer, a light-emitting layer, a electron transport layer, and a electron injection layer between the anode electrode and the cathode electrode; and at least one organic compound derivative layer arranged between the anode electrode and the cathode electrode, the organic compound derivative layer having of the following formula:

wherein "M" denotes one metal selected from a group consisting of Ti, Pt and one metal belonging to groups 13 and 14 of periods 3 to 5, and "$R_1$" to "$R_4$" each denotes a material selected from a group consisting of a hydroxy group, an alkylhydroxy group, a methoxy group, an ethoxy group, a hydrogen, an alkyl group ranging from 1 to about 20 carbons, a halogen group, a cyano group, a nitro group, an aryl group ranging from 6 to about 15 carbons, a fused aromatic group having a ring, an aromatic halide group, an alkyamine group, an aryloxy group, an arylamine group, an alkylepoxide group, a vinyl group, an alkymercapto group, an acetoxy group, a siloxane group, and an imide group.

The present invention further provides a method of manufacturing an organic EL display, comprising: preparing a substrate; forming a lower electrode over the substrate; forming an organic compound derivative layer over the lower electrode; forming a hole transport layer over the organic compound derivative layer; forming an organic light-emitting layer; forming an upper electrode over the organic light-emitting layer, wherein the organic compound derivative layer has the formula:

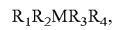

wherein "M" denotes one metal selected from a group consisting of Ti, Pt and one metal among elements belonging to groups 13 and 14 of periods 3 to 5, and "$R_1$" to "$R_4$" each denotes a material selected from a group consisting of a hydroxy group, an alkylhydroxy group, a methoxy group, an ethoxy group, a hydrogen, an alkyl group ranging from 1 to about 20 carbons, a halogen group, a cyano group, a nitro group, an aryl group ranging from 6 to about 15 carbons, a fused aromatic group having a ring, an aromatic halide group, an alkyamine group, an aryloxy group, an arylamine group, an alkylepoxide group, a vinyl group, an alkymercapto group, an acetoxy group, a siloxane group, and an imide group.

The metal M includes Si, Sn or Al. The device further comprises an electron injection layer. The organic compound derivative layer is formed using one of a dip coating technique, a spin coating technique, a roll coating technique, and a vacuum depositing technique. A thickness of the organic compound derivative layer is in a range between 1 Å to 1000 Å. A thickness of the organic compound derivative layer is within 100 Å. The organic compound derivative layer has a molecular weight ranging from about 100 to about 10,000 g/mol.

The organic compound derivative layer can further include a surfactant so as to lower a surface tension thereof. The surfactant includes a hydrophobic moiety such as an alkyl group, an alkylaryl group, a fluoroalkyl group, and an alkylsiloxane group, or a hydrophilic moiety such as a sulfate, a sulfonate, a carboxylate, an amide, a betainic structures, and a quarternized ammonium group. Preferably, the surfactant includes a nonionic hydrophobic moiety such as a polyether group and a nonionic fluoride-based surfactant. The surfactant having a relatively low concentration, is preferably in an amount ranging from about 0.1 wt % to about 0.3 wt %, and most preferably is about 0.2 wt %.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Reference will now be made in detail to a preferred embodiment of the present invention, example of which is illustrated in the accompanying drawing.

An organic EL display according to the present invention includes at least one organic compound derivative layer between an anode electrode and a cathode electrode, regardless of a stack structure or type of the organic EL display.

Figure 1:
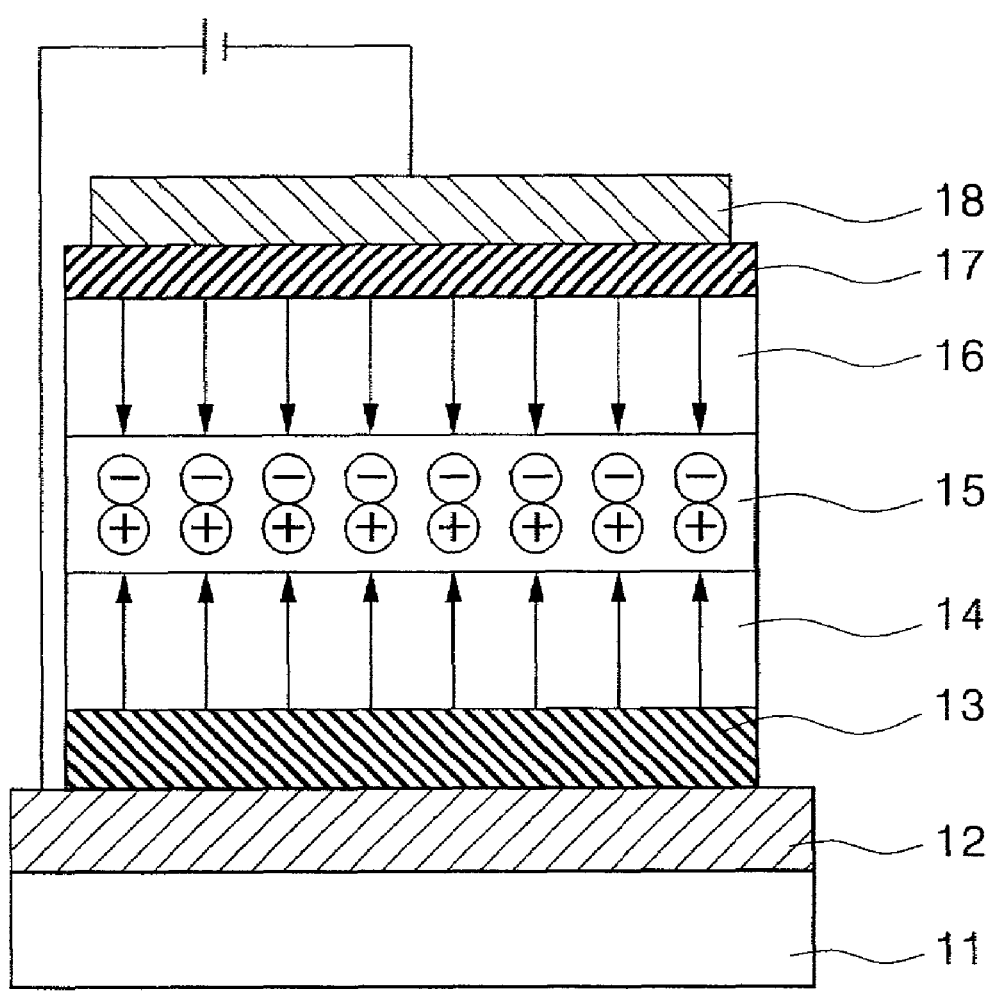
FIG. 1 is a cross-sectional view illustrating a conventional organic EL display.
Figure 2:
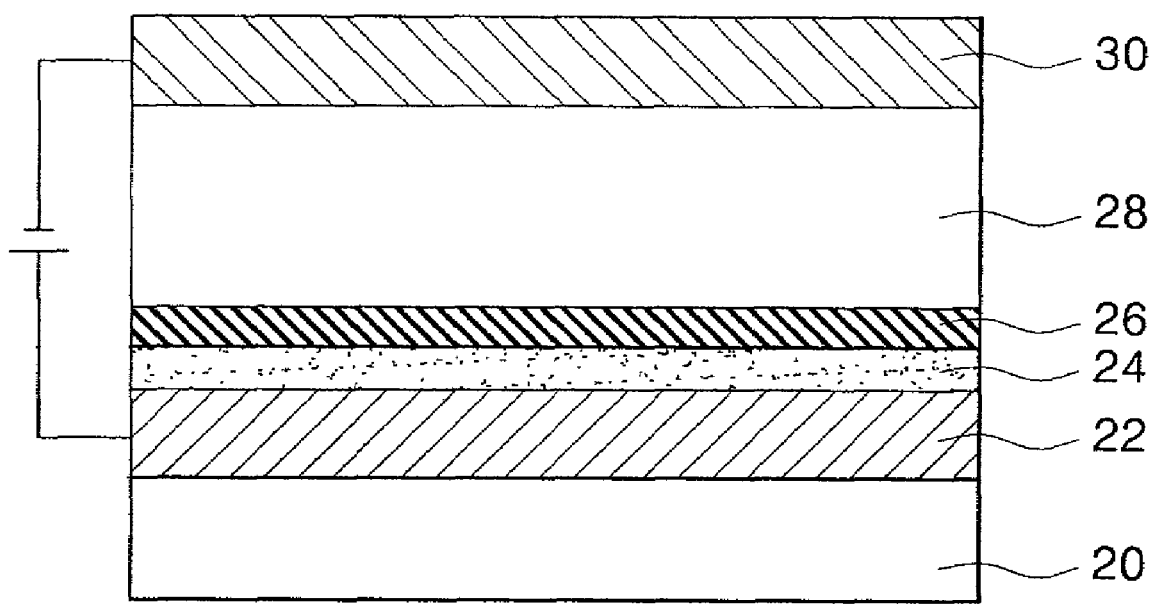
FIG. 2 is a cross-sectional view illustrating an organic EL display according to the present invention.

FIG. 2 is a cross-sectional view illustrating one embodiment of an organic EL display device according to the present invention, and particularly shows a high molecular organic EL display.

Figure 3:
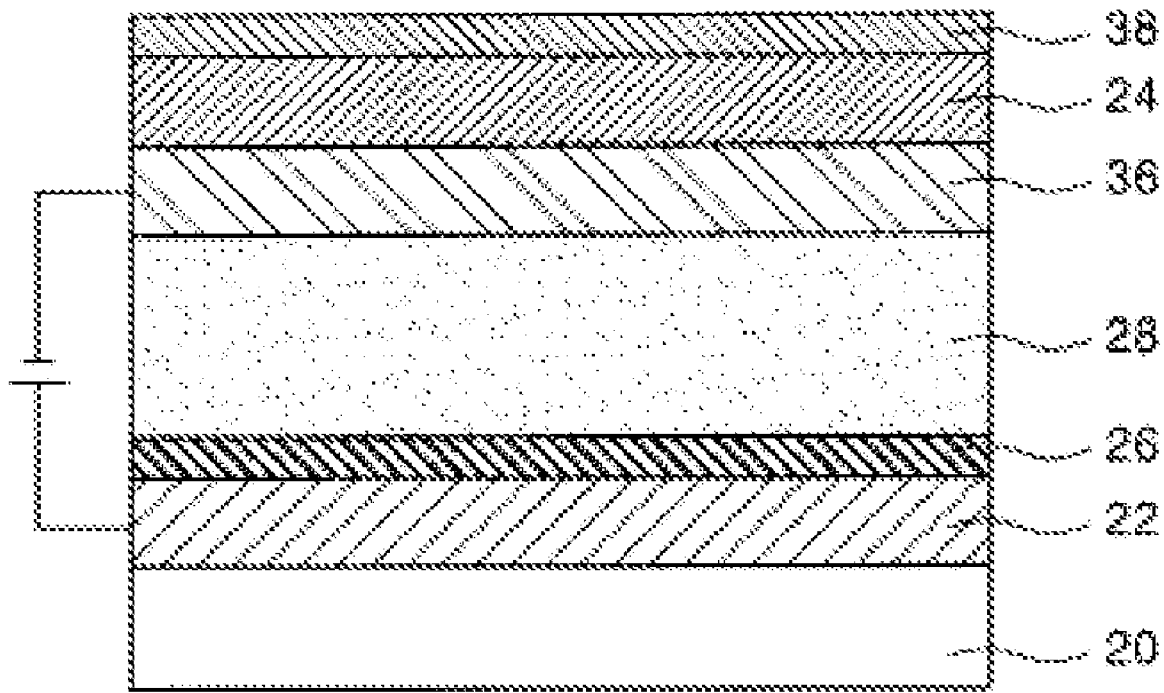
FIG. 3 is a cross-sectional view illustrating an organic EL display according to another exemplary embodiment of the present invention.

FIG. 3 is a cross-sectional view illustrating an organic EL display according to another exemplary embodiment of the present invention.

The organic EL display of FIG. 2 includes an anode electrode 22, an organic compound derivative layer 24, a hole transport layer 26, an organic light-emitting layer 28, and a cathode electrode 30 which are sequentially staked on a substrate 20.

Even though arranged between the anode electrode 22 and the hole transport layer 26, the organic compound derivative layer 24 can be arranged between any two adjacent layers, e.g., between the hole transport layer 26 and the organic light-emitting layer 28, or between the electron transporting layer 36 and the cathode electrode 38, as shown in FIG. 3.

The organic compound derivative layer 24 has both a hydrophobicity and a hydrophilicity, and thus improves an interface characteristic between two layers abutting thereon. As a result, transportability of holes from the anode electrode 22 to the hole transport layer 26 is improved. Meanwhile, when additionally arranged between the cathode electrode 30 and the organic light-emitting layer 28, transportability of electrons from the cathode 30 to the organic light-emitting layer 28 is improved. Accordingly, a light emitting efficiency of the organic EL display is improved, leading to a high brightness.

The organic compound derivative layer 24 can be represented generally by Formula 1:

$$R_1R_2MR_3R_4 \quad \text{(Formula 1)}$$

In Formula 1, "M" denotes one metal selected from a group consisting of Ti, Pt and one metal belonging to groups 13 and 14 of periods 3 to 5 of the periodic table. The metal M preferably includes Si, Sn or Al and more preferably Si. "$R_1$" to "$R_4$" each denotes a material selected from a group consisting of a hydroxy group, an alkylhydroxy group, a methoxy group, an ethoxy group, a hydrogen, an alkyl group ranging for 1 to about 20 carbons, a halogen group, a cyano group, a nitro group, an aryl group ranging 6 to about 15 carbons, a fused aromatic group having a ring, an aromatic halide group, an alkyamine group, an aryloxy group, an arylamine group, an alkylepoxide group, a vinyl group, an alkymercapto group, an acetoxy group, a siloxane group, and an imide group.

Also, the organic EL device of the present invention further can comprise an eletron injection layer.

The organic compound derivative layer may be formed using, e.g., a dip coating technique, a spin coating technique, a roll coating technique, or a vacuum depositing technique. The thickness of the organic compound derivative layer may range from several angstroms to thousands of angstroms. The organic compound derivative layer has a thickness preferably ranging from about 1 Å to about 1000 Å and most preferably about 100 Å.

Preferably, the organic compound derivative layer has a molecular weight ranging from about 100 to about 10,000 g/mol.

The organic compound derivative coated or deposited is cured by a heat treatment to provide a stable structure (i.e., network structure). In other words, since functional groups connected to a central metal M are substituents which are easily substituted after coating or deposition, the organic compound derivative layer forms a crosslinked structure through a substitution reaction and a condensation reaction as a result of heat treatment. Accordingly, the organic compound derivative layer has a stable molecular structure, i.e., network structure.

A contact angle of the organic compound derivative to water can be varied from 5° to 130° depending on the concentration and a polarity thereof. Hence, the surface energy of the organic compound derivative layer can be adjusted to be suitable for the layers that abut thereon. In other words, a bonding force between two layers interposing the organic compound derivative layer is improved, whereby the life span of the organic is increased.

In addition, when the organic compound derivative layer is arranged between the hole transport layer 26 and the organic light-emitting layer 28, since it has both a hydrophilic group and a hydrophobic group, the organic light-emitting layer can be formed on the hydrophilic hole transport layer using an ink-jet printing technique or a laser induced thermal imaging (LITI) technique. Accordingly, a full color light emission can be achieved by this simple process.

The organic compound derivative layer can further include a surfactant so as to lower the surface tension thereof. The surfactant includes a hydrophobic moiety such as an alkyl group, an alkylaryl group, a fluoroalkyl group, and an alkylsiloxane group, or a hydrophilic moiety such as a sulfate, a sulfonate, a carboxylate, an amide, a betainic structures, and a quarternized ammonium group. Preferably, the surfactant includes a non-ionic hydrophobic moiety such as a polyether group and a non-ionic fluoride-based surfactant. The surfactant having a relatively low concentration, is preferably in an amount ranging from about 0.1 wt % to about 0.3 wt %, and most preferably is about 0.2 wt %.

Embodiment 1

An anode electrode made of ITO is formed on a substrate to a thickness of 1500 Å to 2000 Å. Then, the substrate is cleaned in acetone and then UV/ozone-treated. A glycidoxypropyltrimethoxy silane (GPS) of 0.1 wt % is dissolved in an IPA/H2O solution having a PH 4 adjusted by an acetic acid and is hydrolyzed during one hour. The substrate is dipped in the GPS solution for 30 minutes, and thereafter is dried in a vacuum atmosphere at an atmospheric temperature, thereby forming an organic compound derivative layer having a thickness of 100 Å. Subsequently, a PEDOT is coated on the organic compound derivative layer at a speed of 3000 rpm. The coated PEDOT layer is baked at a temperature of 200° for five minutes to form a hole transport layer having a thickness of 500 Å. An organic light-emitting layer is formed using a spin coating technique to a thickness of 800 Å. A cathode electrode is then formed. The cathode electrode has a dual-layered structure of Ca and Ag. Finally, a metal cap layer is formed to encapsulate the organic EL display.

A light emitting efficiency of the organic EL display of Embodiment 1 is significantly improved. That is, efficiency is increased from 3.5 cd/A to 4.6 cd/A. Further, the life span of the organic EL display is about twice that for conventional art.

As described herein before, employing the organic compound derivative layer according to the present invention, the organic EL display has a lengthy life span and a high brightness. Also, a full color light emission can be achieved by a simple process.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An organic EL display, comprising:
   an anode electrode;
   a cathode electrode;
   an organic layer comprising a light-emitting layer arranged between the anode electrode and the cathode electrode, a hole transport layer arranged between the anode electrode and the light-emitting layer, and an electron transporting layer arranged between the cathode electrode and the light-emitting layer; and
   at least one organic compound derivative layer arranged between the hole transport layer and the light-emitting layer or between the electron transporting layer and the cathode electrode, the organic compound derivative layer having the formula:

$R_1R_2MR_3R_4$, wherein "M" is Si, one of "$R_1$" to "$R_4$" is an alkyl group ranging from 1 to about 20 carbons, and the other three of "$R_1$" to "$R_4$" are each an acetoxy group.

2. The display of claim 1, further comprising: a layer selected from a hole injection layer and an electron injection layer arranged between the anode electrode and the cathode electrode.

3. The display of claim 1, wherein the organic compound derivative layer is formed using one of a dip coating technique, a spin coating technique, a roll coating technique, and a vacuum depositing technique.

4. The display of claim 1, wherein a thickness of the organic compound derivative layer is in a range from about 1 Å to about 1000 Å.

5. The display of claim 4, wherein the thickness of the organic compound derivative layer is about 100 Å.

6. The display of claim 1, wherein the organic compound derivative layer has a molecular weight ranging from about 100 to about 10,000 g/mol.

7. The device of claim 1, wherein the organic compound derivative layer further includes a surfactant.

8. The device of claim 7, wherein the surfactant includes one selected from the group consisting of an alkyl group, an alkylaryl group, a fluoroalkyl group, and an alkylsiloxane group, a sulfate, a sulfonate, a carboxylate, an amide, a betainic structures, and a quarternized ammonium group.

9. The device of claim 7, wherein the surfactant includes a non-ionic surfactant.

10. The device of claim 9, wherein the non-ionic surfactant is a non-ionic fluoride-based surfactant.

11. The device of claim 7, wherein the surfactant is in an amount ranging from about 0.1 wt % to about 0.3 wt %.

* * * * *